United States Patent
Norris

(10) Patent No.: US 9,232,317 B2
(45) Date of Patent: Jan. 5, 2016

(54) PARAMETRIC TRANSDUCER WITH GRAPHENE CONDUCTIVE SURFACE

(71) Applicant: Turtle Beach Corporation, Poway, CA (US)

(72) Inventor: Elwood Grant Norris, Poway, CA (US)

(73) Assignee: Turtle Beach Corporation, San Diego, CA (US)

(*) Notice: Subject to any disclaimer, the term of this patent is extended or adjusted under 35 U.S.C. 154(b) by 0 days.

(21) Appl. No.: 14/511,566

(22) Filed: Oct. 10, 2014

(65) Prior Publication Data

US 2015/0104046 A1 Apr. 16, 2015

Related U.S. Application Data

(63) Continuation-in-part of application No. 14/337,431, filed on Jul. 22, 2014, now Pat. No. 9,113,260.

(60) Provisional application No. 61/889,791, filed on Oct. 11, 2013.

(51) Int. Cl.
| | | |
|---|---|---|
| *H04R 17/10* | (2006.01) | |
| *B06B 1/02* | (2006.01) | |
| *H04R 19/00* | (2006.01) | |
| *H01L 41/09* | (2006.01) | |

(52) U.S. Cl.
CPC ...... *H04R 17/10* (2013.01); *B06B 1/02* (2013.01); *B06B 1/0292* (2013.01); *H04R 19/005* (2013.01); *H01L 41/09* (2013.01); *H04R 2217/03* (2013.01)

(58) Field of Classification Search
CPC .......... H04R 1/32; H04R 17/10; H04R 19/02; H04R 2217/03; H01L 41/09; H01L 41/0973; B06B 1/0292; B06B 1/0276; B06B 2201/51

USPC ............ 381/77, 79, 152, 384, 387, 394, 399, 381/423, 431; 367/138

See application file for complete search history.

(56) References Cited

U.S. PATENT DOCUMENTS

| | | | |
|---|---|---|---|
| 6,628,791 B1* | 9/2003 | Bank et al. ................. | 381/113 |
| 8,027,488 B2* | 9/2011 | Pompei ....................... | 381/111 |

(Continued)

FOREIGN PATENT DOCUMENTS

WO 2010061060 6/2010

OTHER PUBLICATIONS

Shin Keun-Young et al., "Flexible and transparent graphene films as acoustic actuator electrodes using inkjet printing", 2011, ChemComm 47, 8527-8529.*

(Continued)

*Primary Examiner* — Jesse Elbin
(74) *Attorney, Agent, or Firm* — Sheppard Mullin Richter & Hampton LLP

(57) ABSTRACT

An ultrasonic audio speaker includes an emitter and a driver. The emitter can include a first layer having a conductive surface; a second layer having a conductive surface; and an insulating layer disposed between the first and second conductive surfaces, wherein the first and second layers are disposed in touching relation to the insulating layer. The driver circuit can include two inputs configured to be coupled to receive an audio modulated ultrasonic signal from an amplifier and two outputs, wherein a first output is coupled to the conductive surface of the first layer and the second output is coupled to the conductive surface of the second layer. Either one or both of the conductive surfaces of the first and second layers may be graphene.

18 Claims, 6 Drawing Sheets

(56) References Cited

U.S. PATENT DOCUMENTS

| | | | |
|---|---|---|---|
| 8,041,059 B2 * | 10/2011 | Miyazaki | 381/191 |
| 2007/0127746 A1 * | 6/2007 | Matsuzawa | 381/191 |
| 2007/0154036 A1 | 7/2007 | Matsuzawa | |
| 2011/0242932 A1 * | 10/2011 | Lebental et al. | 367/7 |

OTHER PUBLICATIONS

International Search Report and the Written Opinion for International App. No. PCT/US2014/060158, mailed Mar. 2, 2015, Authorized Officer: De Jong. Coen.

* cited by examiner

PARAMETRIC TRANSDUCER WITH GRAPHENE CONDUCTIVE SURFACE

CROSS-REFERENCE TO RELATED APPLICATIONS

This application is a continuation-in-part of U.S. patent application Ser. No. 14/337,431 filed Jul. 22, 2014, Improved Parametric Transducer Including Visual Indicia and Related Methods, and claims the benefit of U.S. Patent Application Ser. No. 61/889,791 filed Oct. 11, 2013, Method and System for an Ultrasonic Emitter with a Graphene Diaphragm, each of which is hereby incorporated herein by reference in its entirety.

TECHNICAL FIELD

The present disclosure relates generally to parametric emitters for a variety of applications. More particularly, some embodiments relate to an ultrasonic emitter having at least one conductive surface made of graphene.

BACKGROUND OF THE INVENTION

Non-linear transduction results from the introduction of sufficiently intense, audio-modulated ultrasonic signals into an air column. Self-demodulation, or down-conversion, occurs along the air column resulting in the production of an audible acoustic signal. This process occurs because of the known physical principle that when two sound waves with different frequencies are radiated simultaneously in the same medium, a modulated waveform including the sum and difference of the two frequencies is produced by the non-linear (parametric) interaction of the two sound waves. When the two original sound waves are ultrasonic waves and the difference between them is selected to be an audio frequency, an audible sound can be generated by the parametric interaction.

Parametric audio reproduction systems produce sound through the heterodyning of two carrier signals in a non-linear process that occurs in a medium such as air. The carrier signals are typically in the ultrasound frequency range. The non-linearity of the medium results in acoustic signals produced by the medium that are the sum and difference of the ultrasonic carrier signals. Thus, two ultrasound carrier signals that are separated in frequency can result in a difference tone that is within the approximate 20 Hz to 20,000 Hz range of human hearing.

SUMMARY

Embodiments of the technology described herein include an ultrasonic emitter utilizing graphene for a conductive surface.

In accordance with one embodiment, an ultrasonic audio speaker comprises an emitter. The emitter comprises: a first layer having a conductive surface; a second layer having a conductive surface; an insulating layer disposed between the first and second conductive surfaces, wherein the first and second layers are disposed in touching relation to the insulating layer; and a driver circuit having two inputs configured to be coupled to receive an audio modulated ultrasonic carrier signal from an amplifier and two outputs, wherein a first output is coupled to the conductive surface of the first layer and the second output is coupled to the conductive surface of the second layer, and wherein at least one of the conductive surface of the first layer and the conductive surface of the second layer are graphene.

In accordance with another embodiment, an ultrasonic audio speaker comprises an emitter. The emitter comprises: a first layer having a first conductive surface disposed on a substrate and having a resonant frequency; and a second layer having a second conductive surface, wherein at least one of the first conductive surface and the second conductive surface comprise graphene; and a driver circuit having two inputs configured to be coupled to receive an ultrasonic carrier audio signal from an amplifier and two outputs, wherein a first output is coupled to the first conductive surface and the second output is coupled to the second conductive surface, wherein the ultrasonic carrier audio signal has a carrier frequency at the resonant frequency of the first conductive surface, and wherein the driver circuit comprises an inductor connected to form a parallel resonant circuit with the emitter.

In accordance with still another embodiment, an ultrasonic emitter comprises: a first layer having a conductive surface; a second layer having a conductive surface; and an insulating layer disposed between the first and second conductive surfaces, wherein the first and second layers are disposed in touching relation to the insulating layer, and wherein at least one of the conductive surfaces of the first layer and the second layer are graphene.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the accompanying figures. The drawings are provided for purposes of illustration only and merely depict typical or example embodiments of the invention. These drawings are provided to facilitate the reader's understanding of the systems and methods described herein, and shall not be considered limiting of the breadth, scope, or applicability of the claimed invention.

Some of the figures included herein illustrate various embodiments of the invention from different viewing angles. Although the accompanying descriptive text may refer to elements depicted therein as being on the "top," "bottom" or "side" of an apparatus, such references are merely descriptive and do not imply or require that the invention be implemented or used in a particular spatial orientation unless explicitly stated otherwise.

DESCRIPTION

As described herein, various embodiments can be configured to transmit one or more channels of audio using ultrasonic carriers. The transmission of audio using ultrasonic carriers can be used in a variety of difference scenarios/contexts as will be described in greater detail below. For example, various embodiments may be utilized in or for implementing directed or isolated sound systems, targeted audio systems, specialized audio effects, hearing amplifiers/aids, as well as sound alteration.

Embodiments of the systems and methods described herein provide a HyperSonic Sound (also referred to as Hyper-Sound) (HSS) audio system or other parametric audio reproduction systems for a variety of different applications. Certain embodiments provide an ultrasonic emitter (e.g., a thin film emitter) for ultrasonic carrier audio applications.

Figure 1:
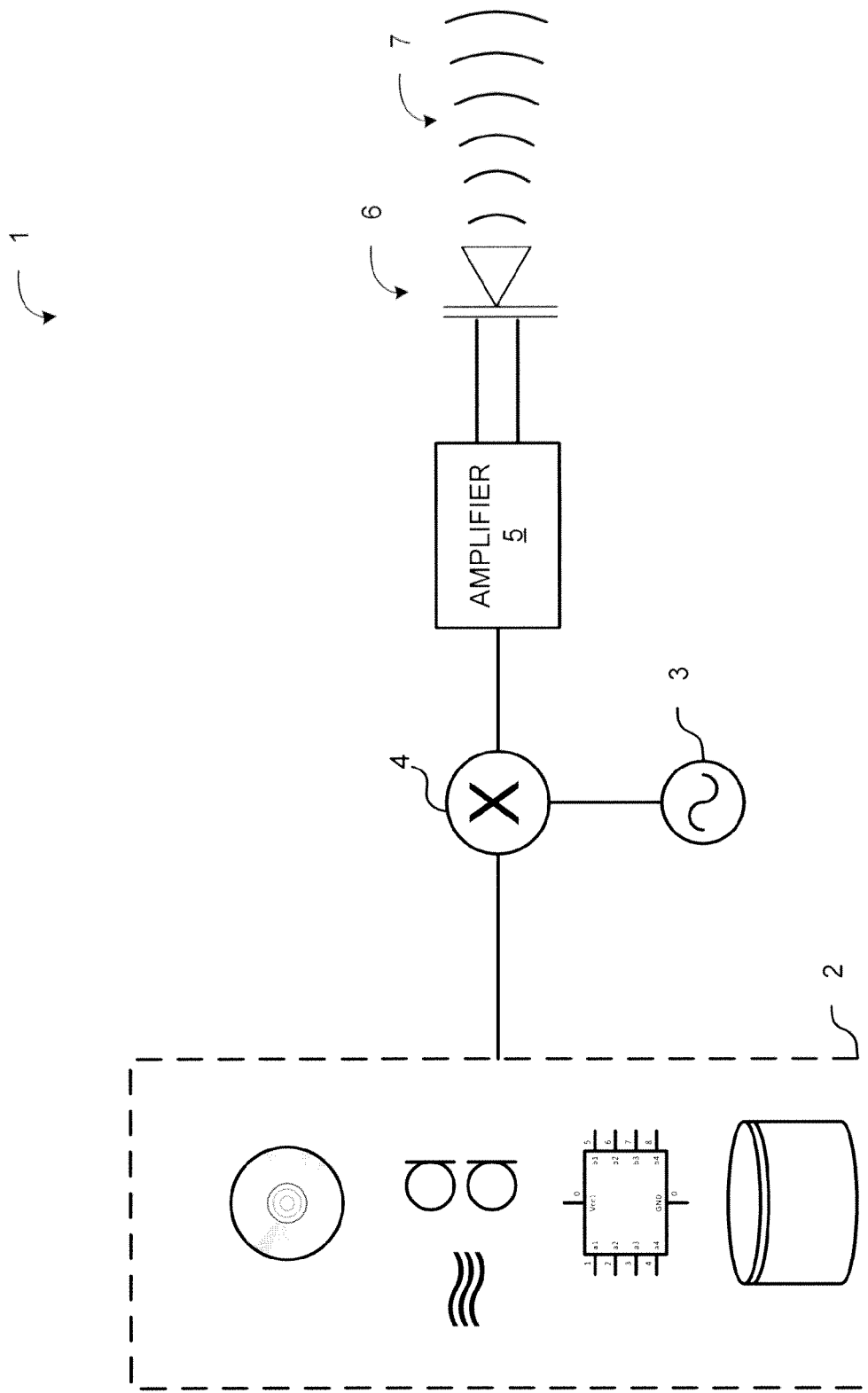
FIG. 1 is a diagram illustrating an ultrasonic sound system suitable for use with the emitter technology described herein.

FIG. 1 is a diagram illustrating an ultrasonic sound system suitable for use in conjunction with the systems and methods described herein. In this exemplary ultrasonic system 1, audio content from an audio source 2, such as, for example, a microphone, memory, a data storage device, streaming media source, MP3, CD, DVD, set-top-box, or other audio source is received. The audio content may be decoded and converted from digital to analog form, depending on the source. The audio content received by the audio system 1 is modulated onto an ultrasonic carrier of frequency f1, using a modulator. The modulator typically includes a local oscillator 3 to generate the ultrasonic carrier signal, and multiplier 4 to modulate the audio signal on the carrier signal. The resultant signal is a double- or single-sideband signal with a carrier at frequency f1 and one or more side lobes. In some embodiments, the signal is a parametric ultrasonic wave or a HSS signal. In most cases, the modulation scheme used is amplitude modulation, or AM, although other modulation schemes can be used as well. Amplitude modulation can be achieved by multiplying the ultrasonic carrier by the information-carrying signal, which in this case is the audio signal. The spectrum of the modulated signal can have two sidebands, an upper and a lower side band, which are symmetric with respect to the carrier frequency, and the carrier itself.

The modulated ultrasonic signal is provided to the emitter (transducer) 6, which launches the ultrasonic (output) signal into the air creating ultrasonic wave 7. When played back through the emitter at a sufficiently high sound pressure level, due to nonlinear behavior of the air through which it is 'played' or transmitted, the carrier in the signal mixes with the sideband(s) to demodulate the signal and reproduce the audio content. This is sometimes referred to as self-demodulation. Thus, even for single-sideband implementations, the carrier is included with the launched signal so that self-demodulation can take place.

Although the system illustrated in FIG. 1 uses a single emitter to launch a single channel of audio content, one of ordinary skill in the art after reading this description will understand how multiple mixers, amplifiers and emitters can be used to transmit multiple channels of audio using ultrasonic carriers. The ultrasonic emitters can be mounted in any desired location depending on the application.

Figure 2:
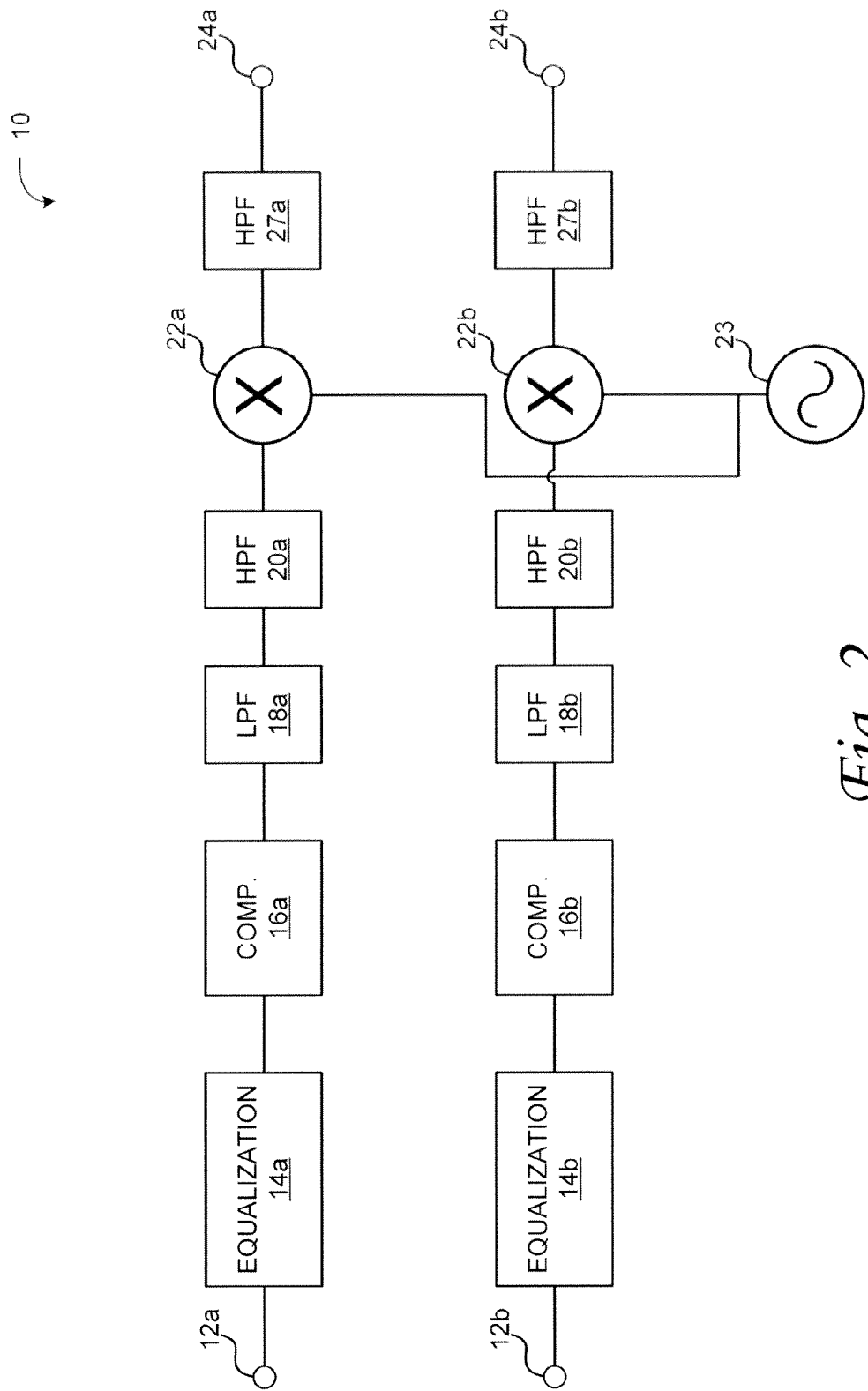
FIG. 2 is a diagram illustrating another example of a signal processing system that is suitable for use with the emitter technology described herein.

One example of a signal processing system 10 that is suitable for use with the technology described herein is illustrated schematically in FIG. 2. In this embodiment, various processing circuits or components are illustrated in the order (relative to the processing path of the signal) in which they are arranged according to one implementation. It is to be understood that the components of the processing circuit can vary, as can the order in which the input signal is processed by each circuit or component. Also, depending upon the embodiment, the processing system 10 can include more or fewer components or circuits than those shown.

Also, the example shown in FIG. 1 is optimized for use in processing two input and output channels (e.g., a "stereo" signal), with various components or circuits including substantially matching components for each channel of the signal. It will be understood by one of ordinary skill in the art after reading this description that the audio system can be implemented using a single channel (e.g., a "monaural" or "mono" signal), two channels (as illustrated in FIG. 2), or a greater number of channels.

Referring now to FIG. 2, the example signal processing system 10 can include audio inputs that can correspond to left 12a and right 12b channels of an audio input signal. Equalizing networks 14a, 14b can be included to provide equalization of the signal. The equalization networks can, for example, boost or suppress predetermined frequencies or frequency ranges to increase the benefit provided naturally by the emitter/inductor combination of the parametric emitter assembly.

After the audio signals are equalized, compressor circuits 16a, 16b can be included to compress the dynamic range of the incoming signal, effectively raising the amplitude of certain portions of the incoming signals and lowering the amplitude of certain other portions of the incoming signals. More particularly, compressor circuits 16a, 16b can be included to narrow the range of audio amplitudes. In one aspect, the compressors lessen the peak-to-peak amplitude of the input signals by a ratio of not less than about 2:1. Adjusting the input signals to a narrower range of amplitude can be done to minimize distortion, which is characteristic of the limited dynamic range of this class of modulation systems. In other embodiments, the equalizing networks 14a, 14b can be provided after compressors 16a, 16b, to equalize the signals after compression.

Low pass filter circuits 18a, 18b can be included to provide a cutoff of high portions of the signal, and high pass filter circuits 20a, 20b providing a cutoff of low portions of the audio signals. In one exemplary embodiment, low pass filters 18a, 18b are used to cut signals higher than about 15-20 kHz, and high pass filters 20a, 20b are used to cut signals lower than about 20-200 Hz.

Figure 6B:
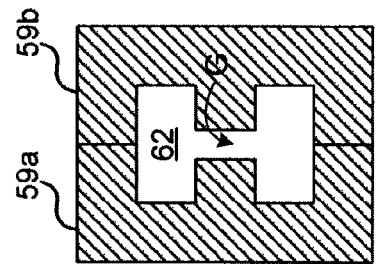
FIG. 6B is a diagram illustrating a cutaway view of an example of a pot core that can be used to form a pot-core inductor serving as the transductor to match the amplifier to the emitter The figures are not intended to be exhaustive or to limit the invention to the precise form disclosed. It should be understood that the invention can be practiced with modification and alteration, and that the invention be limited only by the claims and the equivalents thereof.

The high pass filters 20a, 20b can be configured to eliminate low frequencies that, after modulation, would result in deviation of carrier frequency (e.g., those portions of the modulated signal of FIG. 6 that are closest to the carrier frequency). Also, some low frequencies are difficult for the system to reproduce efficiently and as a result, much energy can be wasted trying to reproduce these frequencies. Therefore, high pass filters 20a, 20b can be configured to cut out these frequencies.

The low pass filters 18a, 18b can be configured to eliminate higher frequencies that, after modulation, could result in the creation of an audible beat signal with the carrier. By way of example, if a low pass filter cuts frequencies above 15 kHz, and the carrier frequency is approximately 44 kHz, the difference signal will not be lower than around 29 kHz, which is still outside of the audible range for humans. However, if frequencies as high as 25 kHz were allowed to pass the filter circuit, the difference signal generated could be in the range of 19 kHz, which is within the range of human hearing.

In the example system 10, after passing through the low pass and high pass filters, the audio signals are modulated by modulators 22a, 22b. Modulators 22a, 22b, mix or combine the audio signals with a carrier signal generated by oscillator 23. For example, in some embodiments a single oscillator (which in one embodiment is driven at a selected frequency of 40 kHz to 50 kHz, which range corresponds to readily available crystals that can be used in the oscillator) is used to drive both modulators 22a, 22b. By utilizing a single oscillator for multiple modulators, an identical carrier frequency is provided to multiple channels being output at 24a, 24b from the modulators. Using the same carrier frequency for each channel lessens the risk that any audible beat frequencies may occur.

High-pass filters 27a, 27b can also be included after the modulation stage. High-pass filters 27a, 27b can be used to pass the modulated ultrasonic carrier signal and ensure that no audio frequencies enter the amplifier via outputs 24a, 24b. Accordingly, in some embodiments, high-pass filters 27a, 27b can be configured to filter out signals below about 25 kHz.

Figure 3:
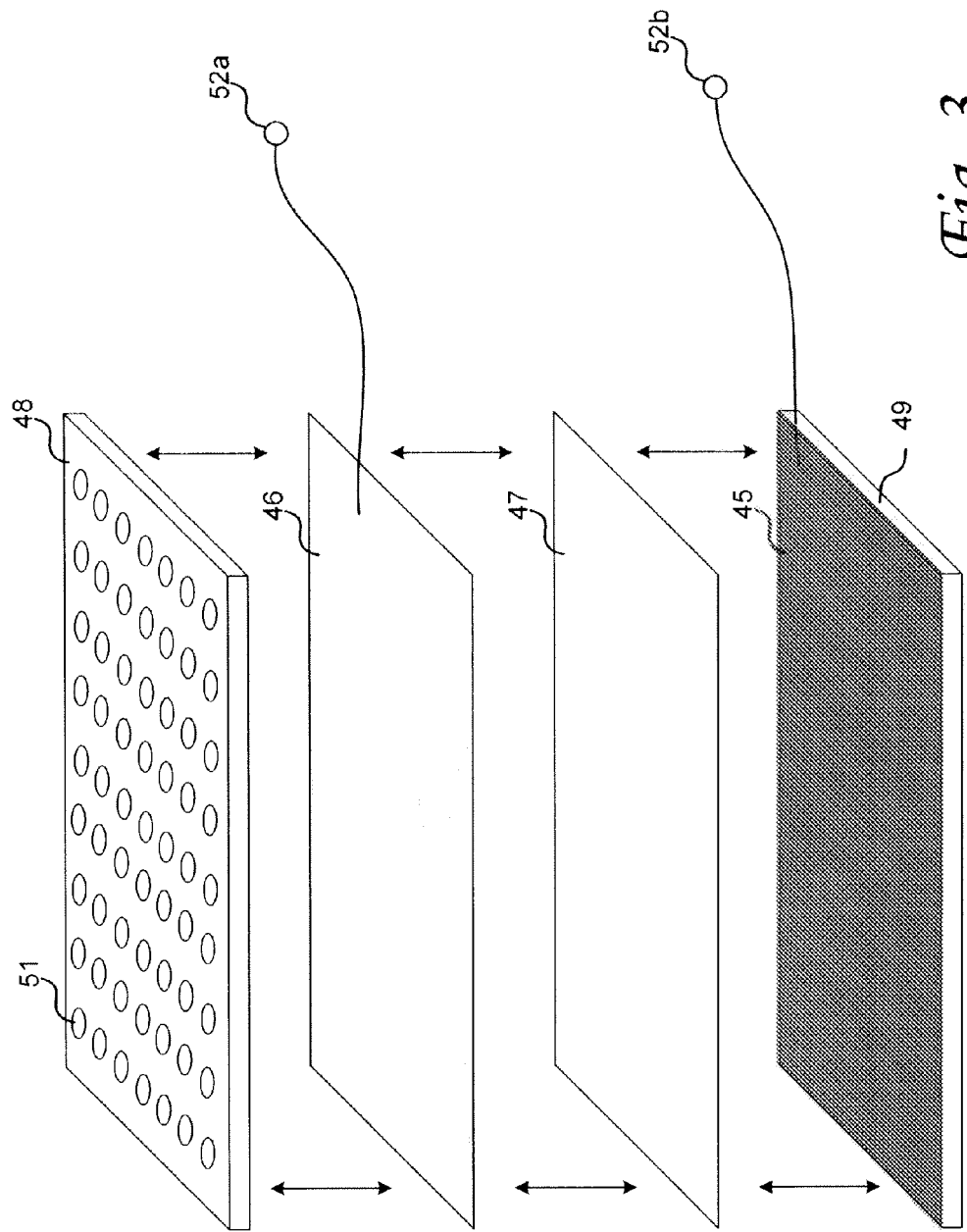
FIG. 3 is a blow-up diagram illustrating an example emitter in accordance with one embodiment of the technology described herein.

FIG. 3 is a blow-up diagram illustrating an example emitter in accordance with one embodiment of the technology described herein. The example emitter shown in FIG. 3 includes one conductive surface 45, another conductive surface 46, an insulating layer 47 and a grating 48. In the illustrated example, conductive layer 45 is disposed on a backing plate 49. In various embodiments, backing plate 49 is a non-conductive backing plate and serves to insulate conductive surface 45 on the back side. For example, conductive surface 45 and backing plate 49 can be implemented as a metalized layer deposited on a non-conductive, or relatively low conductivity, substrate.

As a further example, conductive surface 45 and backing plate 49 can be implemented as a printed circuit board (or other like material) with a metalized layer deposited thereon. As another example, conductive surface 45 can be laminated or sputtered onto backing plate 49, or applied to backing plate 49 using various deposition techniques, including vapor or evaporative deposition, and thermal spray, to name a few. As yet another example, conductive layer 45 can be a metalized film. Further still, conductive layer 45 and 49 can be a singular element.

Conductive surface 45 can be a continuous surface or it can have slots, holes, cut-outs of various shapes, or other non-conductive areas. Additionally, conductive surface 45 can be a smooth or substantially smooth surface, or it can be rough or pitted. For example, conductive surface 45 can be embossed, stamped, sanded, sand blasted, formed with pits or irregularities in the surface, deposited with a desired degree of 'orange peel' or otherwise provided with texture.

Conductive surface 45 need not be disposed on a dedicated backing plate 49. Instead, in some embodiments, conductive surface 45 can be deposited onto a member that provides another function, such as a member that is part of a speaker housing. Conductive surface 45 can also be deposited directly onto a wall or other location where the emitter is to be mounted, and so on.

Conductive surface 46 provides another pole of the emitter. Conductive surface can be implemented as a metalized film, wherein a metalized layer is deposited onto a film substrate (not separately illustrated). The substrate can be, for example, polypropylene, polyimide, polyethylene terephthalate (PET), biaxially-oriented polyethylene terephthalate (e.g., Mylar, Melinex or Hostaphan), Kapton, or other substrate. In some embodiments, the substrate has low conductivity and, when positioned so that the substrate is between the conductive surfaces of layers 45 and 46, acts as an insulator between conductive surface 45 and conductive surface 46. In other embodiments, there is no non-conductive substrate, and conductive surface 46 is a sheet of conductive material. Graphene or other like conductive materials can be used for conductive surface 46, whether with or without a substrate.

In addition, in some embodiments conductive surface 46 (and its insulating substrate where included) is separated from conductive surface 45 by an insulating layer 47. Insulating layer 47 can be made, for example, using PET, axially or biaxially-oriented polyethylene terephthalate, polypropylene, polyimide, or other insulative film or material.

To drive the emitter with enough power to get sufficient ultrasonic pressure level, arcing can occur where the spacing between conductive surface 46 and conductive surface 45 is too thin. However, where the spacing is too thick, the emitter will not achieve resonance. In one embodiment, insulating layer 47 is a layer of about 0.92 mil in thickness. In some embodiments, insulating layer 47 is a layer from about 0.90 to about 1 mil in thickness. In further embodiments, insulating layer 47 is a layer from about 0.75 to about 1.2 mil in thickness. In still further embodiments, insulating layer 47 is as thin as about 0.33 or 0.25 mil in thickness. Other thicknesses can be used, and in some embodiments, a separate insulating layer 47 is not provided. For example, some embodiments rely on an insulating substrate of conductive layer 46 (e.g., as in the case of a metalized film) to provide insulation between conductive surfaces 45 and 46. One benefit of including an insulating layer 47 is that it can allow a greater level of bias voltage to be applied across the first and second conductive surfaces 45, 46 without arcing. When considering the insulative properties of the materials between the two conductive surfaces 45, 46, one should consider the insulative value of layer 47, if included, and the insulative value of the substrate, if any, on which conductive layer 46 is deposited.

A grating 48 can be included on top of the stack. Grating 48 can be made of a conductive or non-conductive material. In some embodiments, grating 48 can be the grating that forms the external speaker grating for the speaker. Because grating 48 is in contact in some embodiments with the conductive surface 46, grating 48 can be made using a non-conductive material to shield users from the bias voltage present on conductive surface 46. Grating 48 can include holes 51, slots or other openings. These openings can be uniform, or they can vary across the area, and they can be thru-openings extending from one surface of grating 48 to the other. Grating 48 can be of various thicknesses. For example, grating 48 can be approximately 60 mils, although other thicknesses can be used.

Electrical contacts 52a, 52b are used to couple the modulated carrier signal into the emitter. An example of a driver circuit for the emitter is described below.

Figure 4:
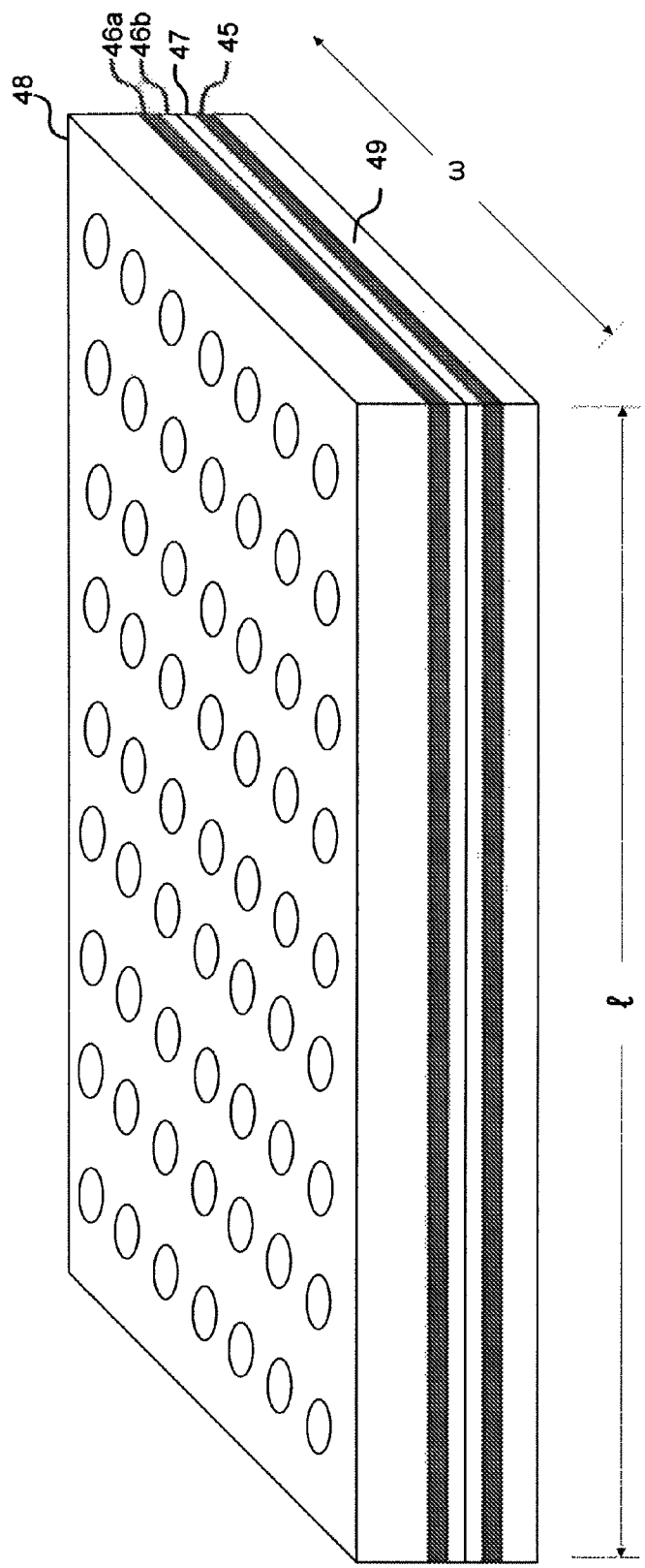
FIG. 4 is a diagram illustrating a cross sectional view of an assembled emitter in accordance with the example illustrated in FIG. 3.

FIG. 4 is a diagram illustrating a cross sectional view of an assembled emitter in accordance with the example illustrated in FIG. 3. As illustrated, this embodiment includes backing plate 49, conductive surface 45, conductive surface 46 (comprising a conductive surface 46a deposited on a substrate 46b), insulating layer 47 between conductive surface 45 and conductive surface 46a, and grating 48. The dimensions in these and other figures, and particularly the thicknesses of the layers, are not drawn to scale.

The emitter can be made to just about any dimension. In one application the emitter is of length, e, 10 inches and its width, w, is 5 inches although other dimensions, both larger and smaller are possible. Practical ranges of length and width can be similar lengths and widths of conventional bookshelf speakers. Greater emitter area can lead to a greater sound output.

Table 1 describes examples of metalized films that can be used to provide conductive surface 46. Low sheet resistance or low ohms/square is preferred for conductive surface 46. Accordingly, films on table 1 having <5 and <1 Ohms/Square exhibited better performance than films with higher Ohms/Square resistance. Films exhibiting 2k or greater Ohms/Square did not provide high output levels in development testing. Mylar and Kapton can be a desirable material because it is relatively temperature insensitive in temperature ranges expected for operation of the emitter. Polypropylene may be less desirable due to its relatively low capacitance. A lower capacitance in the emitter means a larger inductance (and hence a physically larger inductor) is needed to form a resonant circuit. As table 1 illustrates, films used to provide conductive surface 46 can range from about 0.25 mil to 3 mils, inclusive of the substrate.

TABLE 1

| Thickness | Material | Ohms/Sq |
| --- | --- | --- |
| 3 mil | Mylar | 2000 |
| .8 mil | Polypropylene | 5 |
| 3 mil | Meta material | 2000+ |
| ¼ mil | Mylar | 2000+ |
| ¼ mil | Mylar | 2000+ |
| ¼ mil | Mylar | 2000+ |
| ¼ mil | Mylar | 2000+ |
| 3 mil | Mylar | 168 |
| .8 mil | Polypropylene | <10 |
| .92 mil | Mylar | 100 |
| 2 mil | Mylar | 160 |
| .8 mil | Polypropylene | 93 |
| 3 mil | Mylar | <1 |
| 1.67 | Polypropylene | 100 |
| .8 mil | Polypropylene | 43 |
| 3 mil | Mylar | <1 |
| 3 mil | Kapton | 49.5 |
| 3 mil | Mylar | <5 |
| 3 mil | Meta material | |
| 3 mil | Mylar | <5 |
| 3 mil | Mylar | <1 |
| 1 mil | Kapton | <1 |
| ¼ mil | Mylar | 5 |
| .92 mil | Mylar | 10 |

Although not shown in table 1, another film that can be used to provide conductive surface 46 is the DE 320 Aluminum/Polyimide film available from the Dunmore Corporation. This film is a polyimide-based product, aluminized on two sides. It is approximately 1 mil in thickness and provides <1 Ohms/Square. As these examples illustrate, any of a number of different metalized films can be provided as conductive surfaces 45, 46. Metalization is typically performed using sputtering or a physical vapor deposition process. Aluminum, nickel, chromium, copper or other conductive materials can be used as the metallic layer, keeping in mind the preference for low Ohms/Square material.

In other embodiments, materials such as graphene can be used as the conductive surfaces. For example, and in accordance with one embodiment, In accordance with one embodiment, conductive surface 45 can be graphene, and in accordance with another embodiment, conductive surface 46 can be graphene. In accordance with still other embodiments, both conductive surfaces 45 and 46 can be graphene. Graphene is an allotrope of carbon in which carbon atoms are bonded in a repetitive hexagonal pattern. Graphene comprises a one-atom thick layer of mineral graphite in which a plurality of layers may be stacked to create crystalline flake graphite. Graphene possesses superior heat and electrical conductive properties and is believed to be the strongest material known to man. The electron mobility of graphene is approximately 200 times greater than that of silicon. Graphene is very light and a single square meter sheet of graphene weighs approximately 0.77 milligrams. Graphene is flexible with superior elasticity and may be formed into different shapes. Graphene is also transparent and absorbs about 2.3% of incident visible light. Graphene as utilized in accordance with various embodiments described herein may be fabricated to be a suitable thickness to enable optimal resonation of sonic or ultrasonic signals.

Graphene films can be produced with the desired levels of conductivity (e.g., similar to the films described above), and can, in some cases be made as transparent films. Graphene films can be created by a number of techniques. In one example, graphene can be deposited by chemical vapor deposition onto sheets of copper foil (or other sacrificial layer). The graphene can then be coated with a thin layer of adhesive polymer sacrificial layer dissolved away. The graphene can be left on the polymer or pressed against another desired insulating substrate, such as Mylar or Kapton, and the polymer layer removed by heating. The graphene can be treated, for example, with nitric acid, to improve its electrical conductivity. It should be noted that as utilized herein, the term "graphene" can also refer to a graphene alloy, composite, hybrid, and/or other graphene-related material. For example, the graphene material utilized in various embodiments may be a "pure" graphene film described above, or may be an alloy such as a nitrogen-graphene alloy, a hybrid material comprising graphene in combination with a one dimensional nanomaterial, etc.

Figure 5:
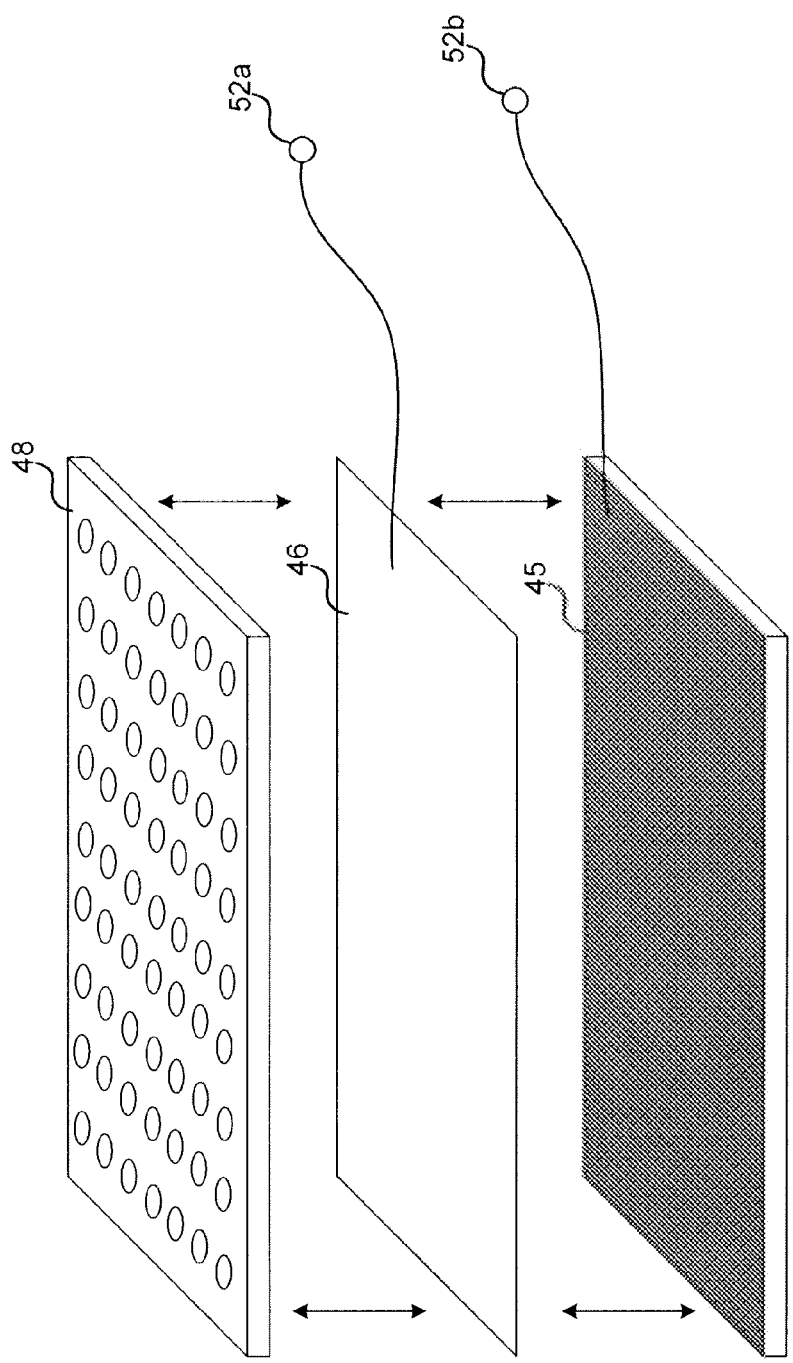
FIG. 5 is a diagram illustrating another example configuration of an ultrasonic emitter in accordance with one embodiment of the technology described herein.

FIG. 5 is a diagram illustrating another example configuration of an ultrasonic emitter in accordance with one embodiment of the technology described herein. The example in FIG. 5 includes conductive surfaces 45 and 46 and grating 48. The difference between the embodiment shown in FIG. 5, and that shown in FIGS. 3 and 4 is that the embodiment shown in FIG. 5 does not include separate insulating layer 47. Layers 45, 46 and 48 can be implemented using the same materials as described above with reference to FIGS. 3 and 4. Particularly, to avoid shorting or arcing between conductive surfaces 45, 46, conductive surface 46 is deposited on a substrate with insulative properties. For example, metalized Mylar or Kapton films like the films shown in Table 1 can be used to implement conductive surface 46, with the film oriented such that the insulating substrate is positioned between conductive surfaces 45, 46.

Figure 6A:
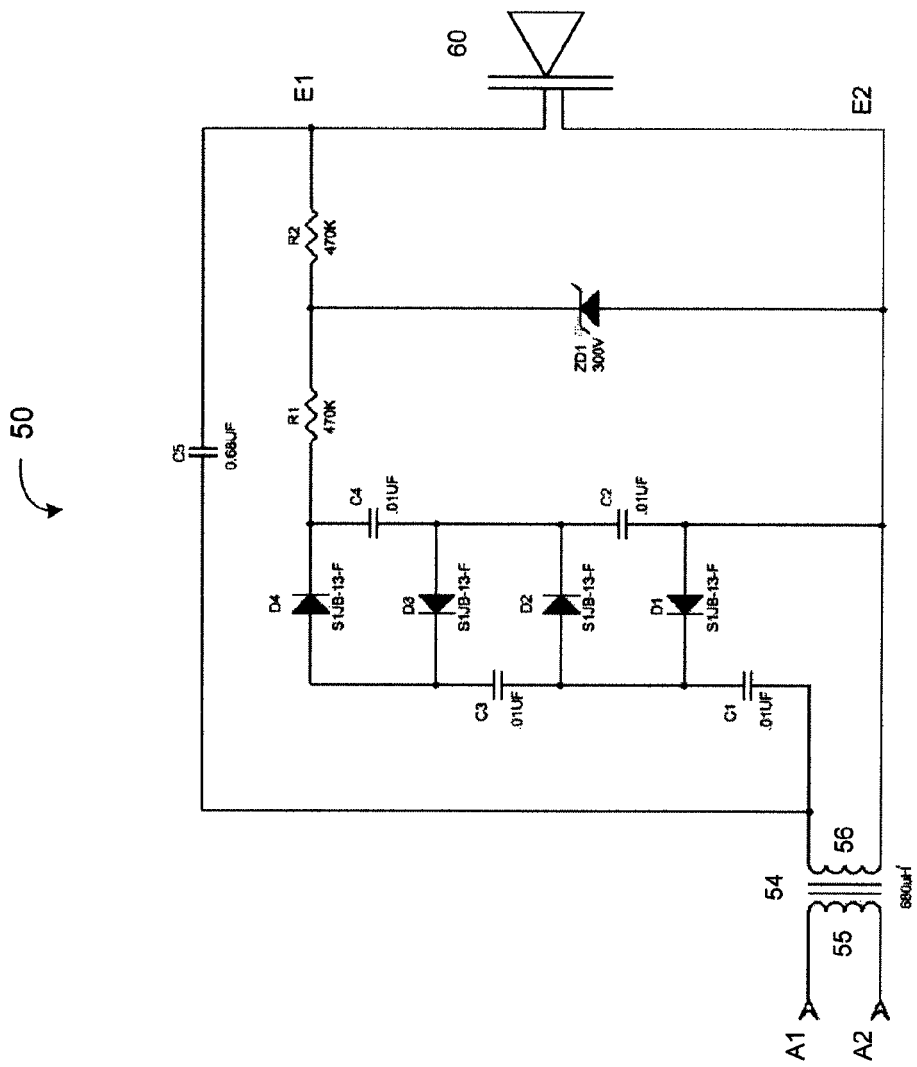
FIG. 6A is a diagram illustrating an example of a simple circuit to drive the emitters disclosed herein and generate a bias voltage at the emitter drawing the necessary voltage from the signal itself. In this example, the circuit is designed to bias at 300V but other voltages are possible by changing diode ZD1.

FIG. 6A is a diagram illustrating an example (self-bias) circuit to generate a D.C. bias voltage at an emitter drawing the necessary voltage from the output signal itself and to drive the emitter. As would be appreciated by one of ordinary skill in the art, where multiple emitters are used (e.g., for stereo applications), a driver/self-bias circuit 50 can be provided for each emitter. In some embodiments, the circuit 50 is provided in the same housing or assembly as the emitter. In other embodiments, the circuit 50 is provided in a separate housing. It should be noted that circuit 50 is only an example, and one of ordinary skill in the art will appreciate that other circuits can be used with the emitter technology described herein.

Referring back to FIG. 2, typically, the modulated signal from the signal processing system 10 is electrically coupled to an amplifier (e.g., amplifier 5). The amplifier can be part of, and in the same housing or enclosure as circuit 50. Alternatively, the amplifier can be separately housed. After amplification, the signal is delivered to inputs A1, A2 of circuit 50 (illustrated in FIG. 6A). In the embodiments described herein, the emitter assembly includes an emitter that can be operable at ultrasonic frequencies. Emitter 60 is connected to circuit 50 by contacts E1, E1. A transducer 54 forms a parallel resonant circuit with the emitter. By configuring the transducer 54 in parallel with the emitter, the current circulates through the transducer 54 and emitter 60 to form a parallel resonant circuit. Accordingly, the capacitance of the emitter becomes important, because lower capacitance values of the emitter require a larger inductance to achieve resonance at a desired frequency. Accordingly, capacitance values of the layers, and of the emitter as a whole can be an important consideration in emitter design.

As alluded to above, circuit 50 not only acts as a driver circuit to drive an emitter, but also acts as a self-bias circuit to generate a bias voltage at the emitter drawing the necessary voltage from the signal itself. The amplifier can be part of, and in the same housing or enclosure as circuit 50. Alternatively, the amplifier can be separately housed. After amplification, the signal is delivered to inputs of circuit 50 used to drive the emitters disclosed herein. As would be appreciated by one of ordinary skill in the art, where multiple emitters are used (e.g., for stereo applications), circuit 50 can be provided for each emitter. In some embodiments, the circuit 50 is provided in the same housing or assembly as the emitter. In other embodiments, the circuit 50 is provided in a separate housing. This circuit is only an example, and one of ordinary skill in the art will appreciate that other driver circuits can be used with the emitter technology described herein or other appropriate bias circuit. In the embodiments described herein, the emitter assembly includes an emitter that can be operable at ultrasonic frequencies.

Emitter 60 is connected to driver circuit 50 by contacts E1 and E2, where a D.C. bias voltage is applied across E1, E2 to provide bias to emitter 60. Ideally, the bias voltage used is approximately twice (or greater than) the reverse bias that the emitter is expected to take on. This is to ensure that bias voltage is sufficient to pull the emitter out of a reverse bias state. In one embodiment, the bias voltage is on the order of 300-450 Volts, although voltages in other ranges can be used. For example, 350 Volts can be used. For ultrasonic emitters, bias voltages are typically in the range of a few hundred to several hundred volts.

A transducer 54 forms a parallel resonant circuit with the emitter. By configuring the transducer 54 in parallel with the emitter, the current circulates through the transducer 54 and emitter 60 and a parallel resonant circuit can be achieved. Accordingly, the capacitance of the emitter becomes important, because lower capacitance values of the emitter require a larger inductance to achieve resonance at a desired frequency. Accordingly, capacitance values of the layers, and of the emitter as a whole can be an important consideration in emitter design.

It should be noted that resonance can be achieved without the direct presence of the transducer in the circulating current path, resulting in more stable and predictable performance of the emitter, and significantly less power being wasted as compared to conventional series resonant circuits. Obtaining resonance at optimal system performance can greatly improve the efficiency of the system (that is, reduce the power consumed by the system) and greatly reduce the heat produced by the system.

Although series resonant arrangements can be used, arranging transducer 54 in parallel with the emitter 60 can provide advantages over series arrangement. This can result in more stable and predictable performance of the emitter, and less power being wasted as compared to series resonant configuration.

An advantage of the circuit 50 shown in FIG. 6A is that the bias can be generated from the ultrasonic carrier signal, and a separate bias supply is not required. In operation, diodes D1-D4 in combination with capacitors C1-C4 are configured to operate as a rectifier and voltage multiplier. Particularly, diodes D1-D4 and capacitors C1-C4 are configured as a rectifier and voltage quadrupler resulting in a DC bias voltage of up to approximately four times the carrier voltage amplitude across nodes E1, E2. Other levels of voltage multiplication can be provided using similar, known voltage multiplication techniques.

Capacitor C5 is chosen large enough to couple the modulated ultrasonic carrier signal to the emitter but present an open circuit to the DC voltage at E1 (i.e., to prevent the DC from shorting to ground). Resistors R1, R2 form a voltage divider, and in combination with Zener diode ZD1, limit the bias voltage to the desired level, which in the illustrated example is approximately 300 Volts. In particular, resistor R2 blocks the carrier passed by capacitor C5 (allowing it to pass to the emitter), while Zener diode ZD1 locks the voltage for setting the bias voltage at the desired level.

Transducer 54 can be of a variety of types known to those of ordinary skill in the art. However, transformers generate a magnetic field that can "radiate" beyond the confines of the device. This field can interfere with the operation and/or response of the emitter as well as other equipment in its vicinity. Additionally, it should be noted that many conventional transducer/emitter pairs used in ultrasonic sound applications operate at voltages that generate large amounts of thermal energy. Heat can negatively affect the performance of a parametric emitter. Therefore, and in accordance with various embodiments, due to the introduction of an air gap in the transducer and due to configuring the transducer 54 in parallel with the emitter in accordance with various embodiments (as described herein) saturation (and the creation of heat) can be avoided.

For at least these reasons, in most conventional parametric sound systems the inductor is physically located a considerable distance from the emitter. While this solution addresses the issues outlined above, it adds another complication. The signal carried from the inductor to the emitter is can be a relatively high voltage (on the order of 160 V peak-to-peak or higher). As such, the wiring connecting the inductor to the emitter must be rated for high voltage applications. Also, long runs of the wiring may be necessary in certain installations, which can be both expensive and dangerous, and can also interfere with communication systems not related to the parametric emitter system.

The transducer 54 (including as a component as shown in the configuration of FIG. 6A) can be implemented using a pot core inductor. A pot core inductor is housed within a pot core that is typically formed of a ferrite material. This confines the inductor windings and the magnetic field generated by the inductor. Typically, the pot core includes two ferrite halves 59a, 59b that define a cavity 62 within which the windings of the inductor can be disposed. See FIG. 6B. An air gap G can be included to increase the permeability of the pot core without affecting the shielding capability of the core. Thus, by increasing the size of the air gap G, the permeability of the pot core is increased. However, increasing the air gap G also requires an increase in the number of turns in the inductor(s) held within the pot core in order to achieve a desired amount of inductance. Thus, an air gap can increase permeability and at the same time reduce heat generated by the pot core inductor, without compromising the shielding properties of the core. It should be noted that the terms transformer and transductor may be used interchangeably in the context of the present disclosure. It should further be noted that various types of transformers/transductors may be utilized in accordance with various embodiments. Examples of transformers/transductors that can be utilized in and/or configured in accordance with various embodiments are disclosed in U.S. Pat. No. 8,391,514, which is incorporated herein by reference in its entirety.

In the examples illustrated in FIG. 6A, a matching transductor is used. However, the primary 55 and secondary 56 windings can be combined in what is commonly referred to as an autotransformer configuration.

As discussed above, it is desirable to achieve a parallel resonant circuit with the secondary winding 56 of transductor 54 and the emitter. It is also desirable to match the impedance of the primary winding 55 of the transductor/emitter pair 54/60 with the impedance expected by the amplifier.

An additional benefit of increasing the size of the air gap is that the physical size of the pot core can be reduced. Accordingly, a smaller pot core transformer can be used while still providing the same inductance to create resonance with the emitter.

The use of a matching transductor provides additional advantages for the present system. Because the transformer "steps-up" from the direction of the amplifier to the emitter, it necessarily "steps-down" from the direction of the emitter to the amplifier. Thus, any negative effects that might otherwise travel from the transductor/emitter pair to the amplifier is reduced by the step-down process, thus minimizing the effect of any such event on the amplifier and the system in general (in particular, changes in the transductor/emitter pair that might affect the impedance load experienced by the amplifier are reduced).

Although not shown in the figures, where the bias voltage is high enough, arcing can occur between conductive layers 45, 46 (FIG. 4). This arcing can occur through the intermediate insulating layers as well as at the edges of the emitter (around the outer edges of the insulating layers. Accordingly, the insulating layer 47 can be made larger in length and width than conductive surfaces 45, 46, to prevent edge arcing. Likewise, where conductive layer 46 is a metalized film on an insulating substrate, conductive layer 46 can be made larger in length and width than conductive layer 45, to increase the distance from the edges of conductive layer 46 to the edges of conductive layer 45.

As described herein, various embodiments can be configured to transmit one or more channels of audio using ultrasonic carriers. The transmission of audio using ultrasonic carriers can be used in a variety of different scenarios/contexts as will be described in greater detail below. For example, various embodiments may be utilized in or for implementing directed/targeted or isolated sound systems, specialized audio effects, hearing amplifiers/aids, as well as sound alteration.

Targeted or isolated sound systems can refer to systems that direct audio to a particular target. That is, an aforementioned HSS audio sound system can be utilized to create a "zone" of audio using an ultrasonic carrier that is highly directional. Accordingly, an audio signal modulated on an ultrasonic carrier signal can be directed to a specific target or area, where the demodulated audio signal cannot be heard outside of the intended zone of audio.

Accordingly, such targeted or isolated sound systems lend themselves to a myriad of applications. One such application may be warning or alert systems. In an emergency situation, emergency vehicles, such as police cars, ambulances, fire engines, etc., often must navigate through and around road traffic. Traditionally, such emergency vehicles notify drivers to move out of their path via loud, flashing sirens. This can create noise pollution for surrounding areas, create confusion for drivers that cannot determine whether or not they must pull to the side of a road, etc. Thus, such emergency vehicles may utilize various embodiments to direct warnings or alerts to particular vehicles in traffic or specific areas to direct the drivers of such vehicles accordingly. The beam spread can be adjusted to cover the area desired by the emergency vehicle operator, without unnecessarily broadcasting sound in other directions. It should be noted that the range of a propagated ultrasonic carrier signal can also be varied based on the particular ultrasonic emitter and/or ultrasonic carrier signal frequency that is utilized for transmission. Longer or shorter range transmission can be used as appropriate.

In some embodiments, the system can be configured to dynamically adjust beam width, or spread, of the ultrasonic audio signal by dynamically adjusting the shape of the back plate. For example, in the case of the emergency vehicles as described above, it may be desirable for emergency vehicle to confine the sound of sirens or other warnings into a relatively narrow beam to cover the road ahead without bleeding over into the surrounding neighborhood. However, when approaching intersections, it may be desirable to have a wider beam to warn approaching vehicles from either side that the emergency vehicle is approaching on the cross street. Accordingly, the beam can be widened as the emergency vehicle approaches intersections to provide warning to one coming cross traffic. Information from external sources can be provided to the system to allow the system to determine when and how much to spread the beam. For example, information from the GPS system can be used to indicate to emitter adjustment mechanism information that may be useful in this regard. This can include, for example, the width of the road on which the emergency vehicles is traveling, upcoming bends or curves in the road, upcoming intersections, and so on. Additionally, traffic information provided by such systems can be fed to the emitter adjustment mechanism to allow the adjustment may be appropriate for a given traffic densities. As another example, emergency vehicle alert systems such as those used to trigger signal lights on the approach of emergency vehicles, can also be used to feedback information to the emergency vehicle they can be used by the emitter adjustment mechanism to adjust the topography of the ultrasonic emitters. As yet another example information as to the speed of the emergency vehicle can be fed to the emitter adjustment mechanism to allow adjustments to be made in accordance with speed. These can be, for example, the beam spread as well as the volume of the emitted signal.

Another application may be for directing the visually impaired at crosswalks. For example, an ultrasonic sound system can be activated by a visually impaired person at a crosswalk, and the ultrasonic sound system can be used to relay instructions to the visually impaired person as he/she walks across a road or any other path where he/she might require assistance. As long as the visually impaired person can hear the directed audio instructions, he/she can be ensured that they are following the correct path and/or at the correct time to avoid an accident.

Still other applications can involve the dispersion of crowds, nuisance animals, and the like. For example, airports currently rely on auditory scarers to attempt to scare birds away from the flight path of airplanes. Current auditory scarers rely on loud explosions using, e.g., propane cannons, but such technologies can be an annoyance to people and surrounding areas. Other conventional auditory scarers rely on ultrasound emitting devices, but the usefulness of such devices is debatable as birds may not be able to hear on the ultrasonic level. For crowd dispersion, the use of megaphones, public address (PA) systems can often cause more distress and confusion rather than diffuse a situation and effectuate control. Therefore, various embodiments can be utilized to again, direct audio modulated on an ultrasonic carrier to target specific areas, such as airports, the roofs of buildings, people, animals, etc. without the negative repercussions of conventional technologies.

Other contexts in which isolated sound systems have value is in confined areas, such as hotel rooms, bedrooms, automobiles, and the like. For example, various embodiments may be utilized to direct audio to an intended receiver or target while excluding unintended receivers from hearing the audio in the same space. Accordingly, an ultrasonic emitter can be implemented as part of one or more sources of audio, such as television, stereo system, etc. for directing audio to an intended listener in a bedroom so that another, e.g., sleeping, person in the bedroom need not be disturbed. Alarm clocks may also incorporate the technologies described herein to direct audible alarms to only an intended party. In vehicles, ultrasonic emitters can be utilized to direct audio signals to particular passengers or areas of the vehicle. For example, directions from a navigation system can be directed solely to a driver of the vehicle, leaving other passengers undisturbed. Additionally, passengers in a vehicle can enjoy separate entertainment media without the need for headphones to isolate themselves. Further expanding on the utility of various embodiments, described herein, conferences or other speaking engagements that may require the translation of speech into different languages can utilize ultrasonic emitters that transmit directed audio in different languages to the appropriate attendees.

Areas where discretion or quiet is preferable can take advantage of various embodiments as well. For example, churches, museums, libraries, theaters, performance venues, etc., can provide auditory signals for various purposes without fear of disturbing the environment. Such areas may also require limited signage or have limited visibility, such as a darkened movie theater or opera venue. Accordingly, ultrasound emitters can be utilized to discreetly direct patrons to seating, for example. Further still, actors, directors, and/or other types of performers can also take advantage of various embodiments described herein, where verbal cues, instructions, or other auditory signals or sounds can be directed to an intended target unbeknownst to audience members. In fact, the acoustical properties of such venues may even be improved through the use of the technologies described herein, as conventional issues such as reverberation, echo, interference, and the like can be avoided with directional/targeted audio.

Such isolated sound systems can also be extremely useful in situations where there is heavy noise traffic, such as in areas with multiple media systems/audio sources that conventionally, would interfere with each other, e.g., casinos, hospital wards, airports, sports bars, family rooms, video game arcades, and the like. For example, various embodiments may be used to isolate audio from televisions to patients in hospital beds that may only be separated by a screen, and kiosks, status monitors in airports, or ATMs that provide directions, instructions, generalized information, personalized information to users. Such isolated sounds systems can also be leveraged in personal computing devices, such as tablet PCs, mobile devices, such as cellular phones, smart phones, PDAs, etc. to provide privacy for users and avoid disturbing nearby people. Even devices traditionally aimed at isolating audio such as headphones, earbuds, and the like can leak audio, and therefore, various embodiments can be utilized to improve the performance of such devices. Moreover, noise cancellation can be accomplished in accordance with various embodiments as well, where the size and shape of the environment would determine the configuration of the sound pattern desired.

Another area where targeted audio can be applied is in advertising and marketing. Targeted audio, whether in the form of advertisements, informational messages, or the like can be directed to specific areas of a retail establishment, shopping center, or to particular patrons/customers. For example, as a customer walks through particular aisles of a grocery store, or as potential customers pass by establishments, advertising messages can be directed to them, i.e., digital signage. Point of sale (POS) devices, such as electronic payment devices, vending machines, and the like can all be enhanced with targeted audio, such as again, advertising, informational/instructional messages, etc. It should be noted that the aforementioned advantages previously described can also act to enhance advertising, such as making it less intrusive, making it more effective by targeting a more appropriate consumer rather than relying on, e.g., general announcements.

Still other uses of the technologies described herein include generating specialized audio effects and altering sound characteristics. For example, an array of ultrasonic emitters configured in accordance with various embodiments may directionally "sweep" one or more audio signals over an audience at a performance venue to provide different sound effects. Likewise, gaming consoles/systems, may utilize various technologies described herein to provide, e.g., a more realistic and/or more immersive sound environment during gameplay by optimally directing audio about a user. The directionality of audio provided by various embodiments can be used to bounce or reflect audio signals to simulate audio sources from various locations without, produce special effects, etc.

Various embodiments may also be utilized to provide auditory feedback to a person speaking. For example, voice can be fed back to a speaker's ears using an ultrasonic emitter that varies the audio signal(s) representative of the speaker's voice to cause the speaker to speak for more loudly or more quietly.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An ultrasonic audio speaker, comprising:
an emitter, the emitter comprising:
a first layer having a conductive surface;
a second layer having a conductive surface;
an insulating layer disposed between the first and second conductive surfaces, wherein the first and second layers are disposed in touching relation to the insulating layer;
a driver circuit having two inputs configured to be coupled to receive an audio modulated ultrasonic carrier signal from an amplifier and two outputs, wherein a first output is coupled to the conductive surface of the first layer and the second output is coupled to the conductive surface of the second layer, and wherein at least one of the conductive surface of the first layer and the conductive surface of the second layer are graphene; and
a bias voltage source configured to apply a bias voltage across the emitter.

2. The ultrasonic audio speaker according to claim 1, wherein an alternative one of the conductive surface of the first layer or the conductive surface of the second layer comprises a metalized film when only one of the conductive surface of the first layer or the conductive surface of the second layer comprises graphene.

3. The ultrasonic audio speaker according to claim 1, wherein the conductive surface of the first layer has a resonant frequency, and wherein the modulated ultrasonic carrier signal has a carrier frequency at the resonant frequency of the conductive surface of the first layer.

4. The ultrasonic audio speaker according to claim 3, wherein the driver circuit comprises a transductor connected to form a parallel resonant circuit with the emitter.

5. The ultrasonic audio speaker according to claim 1, wherein the conductive surface of the first layer has a resistance of less than 3 ohms/square.

6. The ultrasonic audio speaker according to claim 1, wherein the conductive surface of the first layer has a resistance of less than 1 ohms/square.

7. The ultrasonic audio speaker according to claim 1, further comprising a grating disposed adjacent the conductive surface of the first layer.

8. The ultrasonic audio speaker according to claim 1, wherein the driver circuit comprises a transductor connected in parallel with the emitter.

9. The ultrasonic audio speaker according to claim 1, wherein the bias voltage is within the range of from 200 to 500 volts.

10. The ultrasonic audio speaker according to claim 1, wherein the bias voltage is large enough to overcome a reverse bias on the emitter.

11. The ultrasonic audio speaker according to claim 1, wherein the conductive surface of the first layer comprises a conductive grating.

12. An ultrasonic audio speaker, comprising:
an emitter, the emitter comprising:
a first layer having a first conductive surface disposed on a substrate, and having a resonant frequency; and
a second layer having a second conductive surface, wherein at least one of the first conductive surface and the second conductive surface comprise graphene;
a driver circuit having two inputs configured to be coupled to receive an ultrasonic carrier audio signal from an amplifier and two outputs, wherein a first output is coupled to the first conductive surface and the second output is coupled to the second conductive surface, wherein the ultrasonic carrier audio signal has a carrier frequency at the resonant frequency of the first conductive surface, and wherein the driver circuit comprises an inductor connected to form a parallel resonant circuit with the emitter; and
a bias voltage source configured to apply a bias voltage across the emitter.

13. The ultrasonic audio speaker according to claim 12, further comprising an insulating layer disposed between the first and second conductive surfaces.

14. The ultrasonic audio speaker according to claim 12, further comprising a grating disposed adjacent the first conductive layer.

15. The ultrasonic audio speaker according to claim 12, wherein the second conductive layer comprises a conductive grating.

16. The ultrasonic audio speaker according to claim 12, wherein the bias voltage is within the range of from 200 to 500 volts.

17. The ultrasonic audio speaker according to claim 12, wherein the bias voltage is large enough to overcome a reverse bias on the emitter.

18. The ultrasonic audio speaker according to claim 12, wherein the second conductive surface comprises a rough or pitted surface.

* * * * *